US012745538B2

(12) United States Patent
Cao et al.

(10) Patent No.: US 12,745,538 B2
(45) Date of Patent: Sep. 22, 2026

(54) DISPLAY PANEL AND DISPLAY DEVICE

(71) Applicants: Guangzhou Govisionox Technology Co., Ltd., Guangzhou (CN); Hefei Visionox Technology Co., Ltd., Hefei (CN); KunShan Go-Visionox Opto-Electronics Co., Ltd., Kunshan (CN)

(72) Inventors: Ying Cao, Guangzhou (CN); Tao Li, Guangzhou (CN); Yuan Yao, Guangzhou (CN); Lipeng Gao, Guangzhou (CN)

(73) Assignees: Guangzhou Govisionox Technology Co., Ltd., Guangzhou (CN); Hefei Visionox Technology Co., Ltd., Hefei (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 352 days.

(21) Appl. No.: 18/635,373

(22) Filed: Apr. 15, 2024

(65) Prior Publication Data

US 2024/0268187 A1 Aug. 8, 2024

(30) Foreign Application Priority Data

Sep. 27, 2023 (CN) ......................... 202311273057.4

(51) Int. Cl.
*H10K 59/80* (2023.01)
*H10K 59/122* (2023.01)

(52) U.S. Cl.
CPC ..... *H10K 59/80522* (2023.02); *H10K 59/122* (2023.02)

(58) Field of Classification Search
CPC ....................... H10K 59/80522; H10K 59/122
See application file for complete search history.

(56) References Cited

U.S. PATENT DOCUMENTS

2014/0151652 A1* 6/2014 Im ...................... H10K 59/1315 257/40
2015/0144902 A1* 5/2015 Do ..................... H10K 59/1201 257/40

(Continued)

FOREIGN PATENT DOCUMENTS

CN 107452783 A 12/2017
CN 108269838 A 7/2018

(Continued)

OTHER PUBLICATIONS

Office Action issued on Dec. 3, 2024, in corresponding Japanese Application No. 2024-089348, 10 pages.

(Continued)

*Primary Examiner* — Mary Ellen Bowman
(74) *Attorney, Agent, or Firm* — Maier & Maier, PLLC

(57) ABSTRACT

A display panel includes a substrate, a pixel circuit layer, a light-emitting element, and an auxiliary electrode. The pixel circuit layer is arranged on a side of the substrate and includes a pixel circuit. The pixel circuit includes an initialization transistor. An active layer of the initialization transistor includes a channel region, a first electrode region, and a second electrode region. The light-emitting element is arranged on a side of the pixel circuit layer away from the substrate and electrically connected to the pixel circuit. The light-emitting element includes a first electrode, a light-emitting material layer, and a second electrode laminated on each other. The auxiliary electrode is arranged on the side of the pixel circuit layer away from the substrate and electrically connected to the second electrode. The auxiliary electrode is electrically connected to the second electrode region through a via hole.

19 Claims, 10 Drawing Sheets

(56) References Cited

U.S. PATENT DOCUMENTS

2016/0155790 A1* 6/2016 Lee ........................ H10D 84/01
438/34
2019/0326376 A1* 10/2019 Huo ................... H10K 59/1201
2021/0391400 A1* 12/2021 Kim ..................... H10K 59/121

FOREIGN PATENT DOCUMENTS

CN 111489703 B 7/2021
CN 111916485 B 9/2022
CN 113744692 B 12/2022
EP 2996151 A1 * 3/2016 ........... H10K 59/131
KR 1020160066673 A 6/2016
KR 1020220056162 A 5/2022
KR 1020230104985 A 7/2023

OTHER PUBLICATIONS

Office Action issued on Aug. 29, 2024, in corresponding Korean Application No. 10-2024-0069097, 11 pages.

* cited by examiner

DISPLAY PANEL AND DISPLAY DEVICE

CROSS REFERENCE TO RELATED APPLICATIONS

The present application claims priority of Chinese patent application Ser. No. 202311273057.4, filed Sep. 27, 2023, and contents of which are incorporated herein by its entireties.

TECHNICAL FIELD

The present disclosure relates to the field of displaying, and in particular to a display panel and a display device.

BACKGROUND

As displaying technologies develop, people have increasingly higher requirements for display panels. Performance of display panels is to be further improved.

SUMMARY OF THE DISCLOSURE

The present disclosure provides a display panel and a display device, which has an improved displaying performance.

In a first aspect, a display panel is provided and includes: a substrate; a pixel circuit layer, disposed on a side of the substrate and comprising at least one pixel circuit, wherein the pixel circuit comprises an initialization transistor, an active layer of the initialization transistor comprises a channel region, a first electrode region, and a second electrode region; the first electrode region and the second electrode region are disposed on two sides of the channel region respectively; at least one light-emitting element, disposed on a side of the pixel circuit layer away from the substrate and electrically connected to the pixel circuit, wherein the light-emitting element comprises a first electrode, a light-emitting material layer, and a second electrode disposed in a laminated manner; at least one auxiliary electrode, disposed on the side of the pixel circuit layer away from the substrate and electrically connected to the second electrode, wherein each of the at least one auxiliary electrode is electrically connected to the second electrode region of the active layer of the initialization transistor through a via hole.

In a second aspect, a display device is provided and includes the display panel in the first aspect.

According to the present disclosure, the display panel is arranged with an auxiliary electrode. The auxiliary electrode is electrically connected, via the first via hole, to the second electrode region of the active layer in the first initialization transistor. That is, the pixel circuit is initialized directly by the auxiliary electrode. In this way, the performance of the display panel is improved. For example, a space for arranging wires is optimized, and light transmittance is improved.

BRIEF DESCRIPTION OF THE DRAWINGS

In order to more clearly illustrate the technical solutions in the embodiments of the present disclosure or in the related art, the accompanying drawings for describing the embodiments or the related art will be introduced briefly in the following. Apparently, the following description of the accompanying drawings shows only some of the embodiments of the present disclosure. Any ordinary skilled person in the art may obtain other accompanying drawings based on the accompanying drawings without any creative work.

DETAILED DESCRIPTION

Technical solutions in the embodiments of the present disclosure will be described clearly and completely in the following by referring to the accompanying drawings in the embodiments of the present disclosure. Apparently, the described embodiments are only some of but not all of the embodiments of the present disclosure. All other embodiments, which are obtained by any ordinary skilled person in the art based on the embodiments in the present disclosure without any creative work, shall fall within the scope of the present disclosure.

It should be noted that the terms "first" and "second" herein are used for descriptive purposes only and shall not be understood as indicating or implying relative importance or implicitly specifying the number of technical features indicated. Therefore, a feature defined by the "first" or "second" may explicitly or implicitly include at least one such feature. In the present disclosure, "plurality" means at least two, such as two, three, and so on, unless otherwise expressly and specifically defined. In addition, the terms "comprise", "have", and any variations thereof, are intended to cover non-exclusive inclusion. For example, a process, a method, a system, a product or an apparatus comprising a series of operations or units is not limited to the listed operations or units, but optionally further comprises operations or units that are not listed, or optionally comprises other operations or units that are inherently included in the process, the method, the system, the product or the apparatus.

Before describing the technical solutions of the present disclosure, a structure of a display panel will be described firstly as follows.

Figure 1:
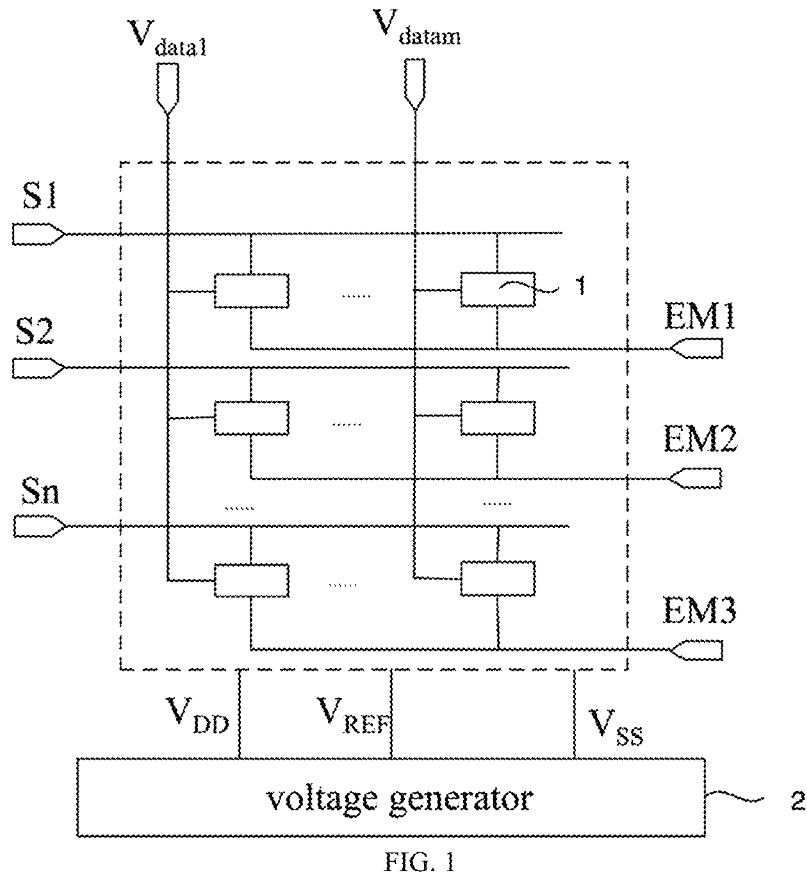
FIG. 1 is a structural schematic view of a display panel in the art.

As shown in FIG. 1, the display panel includes a plurality of pixel units 1, a plurality of scan lines S1 to Sn, a plurality of data lines $V_{data1}$ to $V_{datam}$, a plurality of light emission control lines EM1 to EMn, and a voltage generator 2. Each scan line is substantially perpendicular to each data line. Each pixel unit 1 is disposed in an area defined by the scan line intersecting with the data line. Each pixel unit 1 includes a light-emitting element and a pixel circuit for driving the light-emitting element to emit light. Each pixel circuit is connected to a first power supply line $V_{DD}$, a second power supply line $V_{SS}$, and an initial voltage signal line $V_{REF}$. The first power supply line $V_{DD}$ is configured to transmit a first voltage signal to an anode of the light-emitting element, and the first voltage signal is a high voltage level signal. The second power supply line $V_{SS}$ is configured to transmit a second voltage signal to a cathode of the light-emitting element, and the second voltage signal is a low voltage level signal. The initial voltage signal line $V_{REF}$ is configured to input a reference voltage to the pixel circuit to initialize the pixel circuit. The number of initial voltage signal lines $V_{REF}$ may be one or two, which will be described below.

Figure 2:
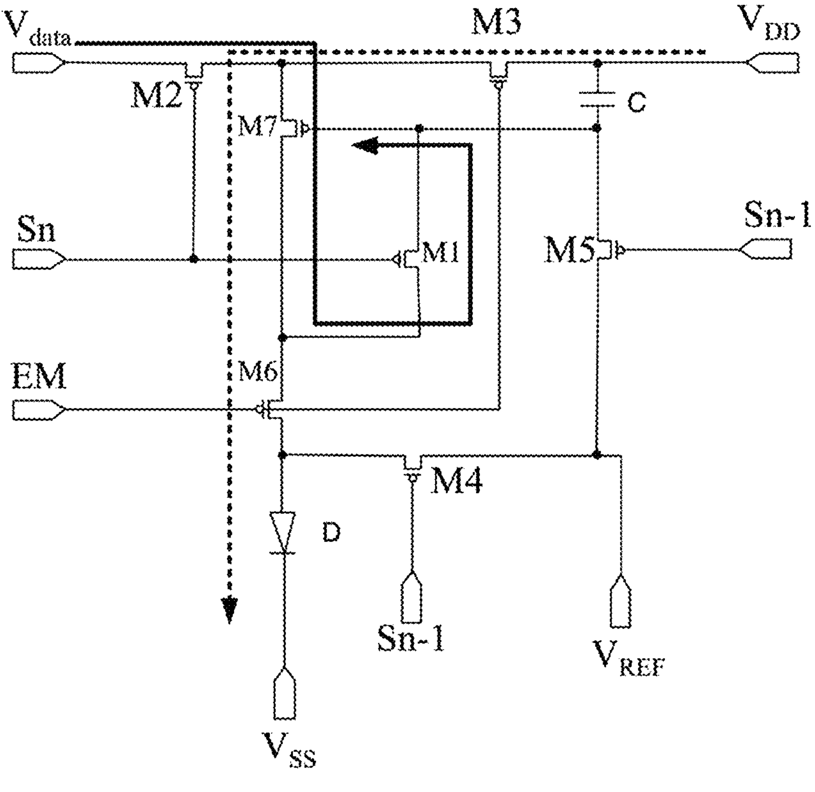
FIG. 2 is a structural schematic view of a pixel circuit in the art.

The pixel circuit may be a 7T1C circuit, a 9T1C, a 6T2C, or various other types of circuits. As shown in FIG. 2, in an example, the pixel circuit is the 7T1C circuit, and a specific operation of the pixel circuit will be described below.

In a case shown in FIG. 2, the pixel circuit includes a first transistor M1, a second transistor M2, a third transistor M3, a fourth transistor M4, a fifth transistor M5, a sixth transistor M6, a seventh transistor M7, and a storage capacitor C. Each transistor includes a gate, a first electrode, and a second electrode. The first electrode is one of a source or a drain. The second electrode is the other one of the source or the drain. In some transistors, the first electrode is the source; and in other some transistors, the first electrode is the drain. The first electrode being the drain or the source is determined based on a magnitude of a voltage applied to the transistor. The seventh transistor M7 is a drive transistor configured to control a magnitude of a current flowing through a light-emitting element D. Each of the rest transistors is a switch transistor. Each of the first transistor M1, the second transistor M2, the third transistor M3, the fourth transistor M4, the fifth transistor M5, the sixth transistor M6, and the seventh transistor M7 may be any one of: a low-temperature polycrystalline silicon thin-film transistor, oxide semiconductor thin-film transistor, and an amorphous silicon thin-film transistor. The transistor may be a P-type thin-film transistor or an N-type thin-film transistor. When the P-type thin-film transistor is used, a low voltage level signal needs to be input to a gate of the transistor when the transistor is to be conducted. When the N-type thin-film transistor is used, a high voltage level signal needs to be input to a gate of the transistor when the transistor is to be conducted.

Specifically, the gate of the first transistor M1 is connected to a scan line Sn of a pixel row in which the light-emitting element D is located. The gate of the second transistor M2 is connected to the scan line Sn. The first electrode of the first transistor M1 is connected to the second electrode of the seventh transistor M7. The second electrode of the first transistor M1 is connected to the gate of the seventh transistor M7.

The first electrode of the second transistor M2 is connected to the data line $V_{data}$. The second electrode of the second transistor M2 is connected to the first electrode of the seventh transistor M7.

The gate of the third transistor M3 and the gate of the sixth transistor M6 are connected to the light-emitting control line EM. The first electrode of the third transistor M3 is connected to the first electrode of the seventh transistor M7. The second electrode of the third transistor M3 is connected to the first power supply line $V_{DD}$.

The gate of the fourth transistor M4 is connected to a scan line Sn-1 of a pixel line prior to the fourth transistor M4. The first electrode of the fourth transistor M4 is connected to the anode of the light-emitting element D. The second electrode of the fourth transistor M4 is connected to the initial voltage signal line $V_{REF}$.

The gate of the fifth transistor M5 is connected to the scan line Sn-1 of a pixel line prior to the fifth transistor M5. The first electrode of the fifth transistor M5 is connected to the gate of the seventh transistor M7. The second electrode of the fifth transistor M5 is connected to the initial voltage signal line $V_{REF}$.

The gate of the sixth transistor M6 is connected to the light-emitting control line EM. The first electrode of the sixth transistor M6 is connected to the second electrode of the seventh transistor M7. The second electrode of the sixth transistor M6 is connected to the anode of the light-emitting element D. The first electrode of the storage capacitor C is connected to a first power supply line $V_{DD}$. The cathode of the light-emitting element D is connected to the second power supply line $V_{SS}$. The second power supply line $V_{SS}$ is configured to provide a second voltage signal, and the second voltage signal is a negative voltage.

Figure 3:
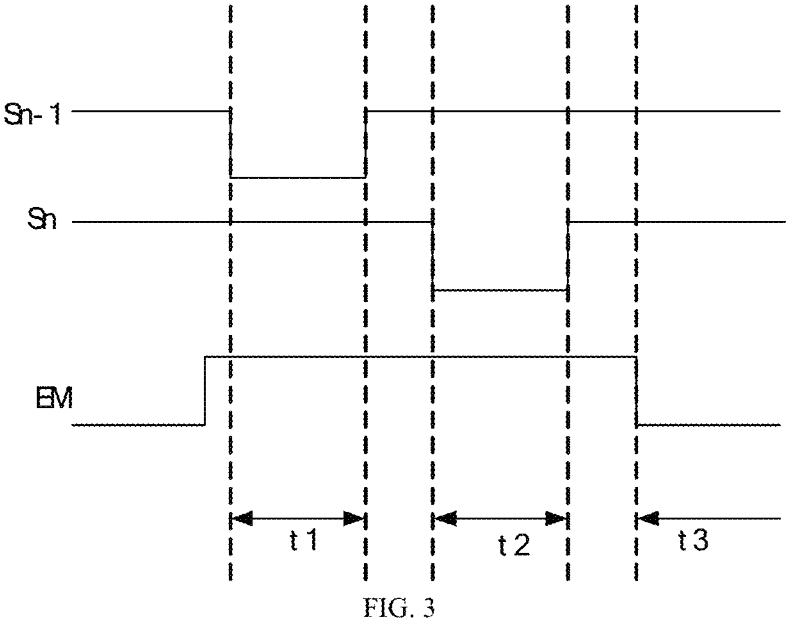
FIG. 3 is a timing diagram of the pixel circuit shown in FIG. 2.

As shown in FIG. 3, a time sequencing when the pixel circuit of FIG. 2 is operating includes an initialization stage t1, a writing stage t2, and a light-emitting stage t3.

In the initialization stage t1, the scan line Sn-1 of the row prior to the light-emitting element D provides a low voltage signal. The light-emitting control line EM and the scan line Sn of the row in which the light-emitting element is located provide a high voltage signal. At this moment, the fourth transistor M4 and the fifth transistor M5 are conducted, a reference voltage is charged to the anode of the light-emitting element D and the gate of the seventh transistor M7 to provide the reference voltage to the anode of the light-emitting element D and to reset the anode of the light-emitting element D. In this way, the initialization is completed.

In the writing stage t2, the light-emitting control line EM and the scan line Sn-1 of the row prior to the light-emitting element D provide a high voltage signal. The scan line Sn of the row in which the light-emitting element D is located provides a low voltage signal. At this moment, as shown by the black solid arrow in FIG. 2, the second transistor M2, the first transistor M1, and the seventh transistor M7 are conducted, a data voltage of the data line Vdata is compensated, and the compensated voltage is charged into the storage capacitor C. The compensated voltage is a difference between the data voltage of the data line $V_{data}$ and an absolute value of a threshold voltage of the seventh transistor M7 (the threshold voltage is a negative value), and is charged into the storage capacitor C. In this way, the stage of writing the data voltage is completed.

In the light-emitting stage t3, the scan line Sn of the row in which the light-emitting element D is located and the scan line Sn-1 of a row prior to the light-emitting element D provide high voltage signals, and the light-emitting control line EM provides a low voltage signal. At this moment, as shown by the black dashed arrow in the FIG. 2, the third transistor M3, the sixth transistor M6, and the seventh transistor M7 are conducted. The first power supply line $V_{DD}$ provides a drive voltage to the anode of the light-emitting element D through the third transistor M3, the sixth transistor M6, and the seventh transistor M7 to cause the light-emitting element D to emit light normally.

Figure 4:
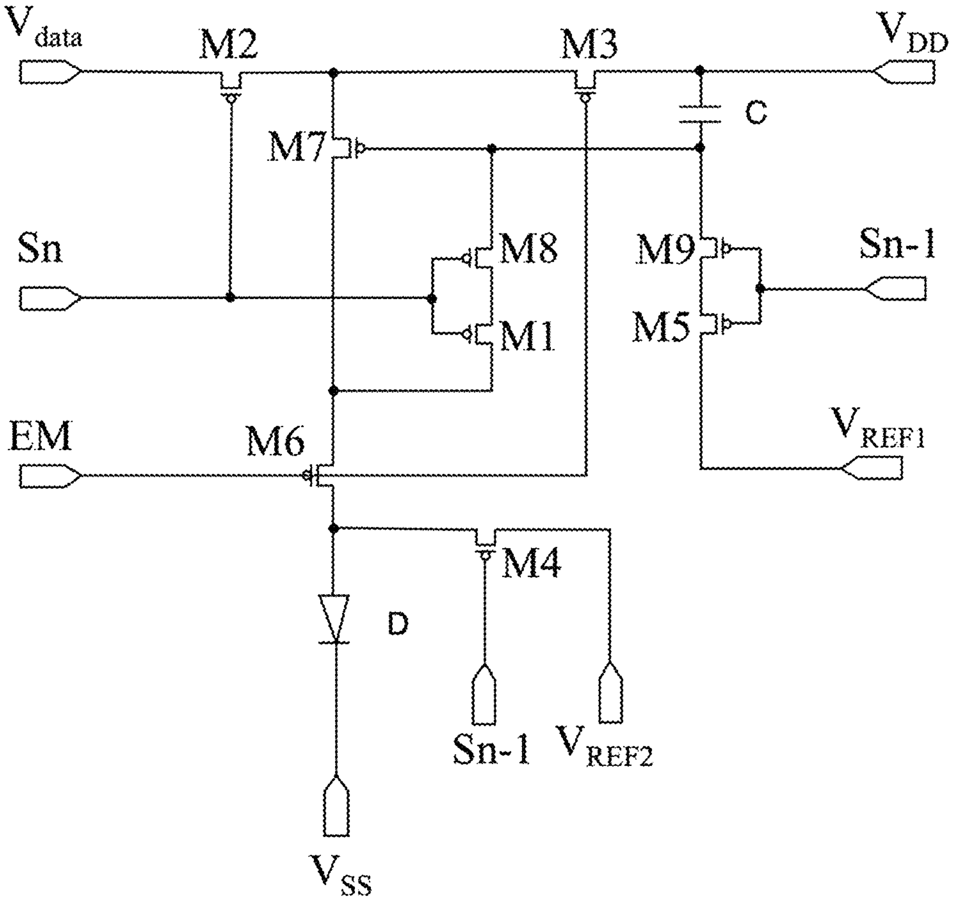
FIG. 4 is another structural schematic view of the pixel circuit in the art.

Each of the fifth transistor M5 and the fourth transistor M4 in FIGS. 2 and 4 may be referred to as the initialization transistor. The fifth transistor M5 and the fourth transistor M4 are conducted in the initialization stage to write the reference voltage to the pixel circuit to initialize the pixel circuit.

According to the above description, in the initialization stage, the reference voltage input to the pixel circuit and the voltage input to the light-emitting element D by the second power supply line Vss are both negative voltages. That is, in the initialization stage, the voltage written into the pixel circuit and the voltage applied to the cathode of the light-emitting element D are both negative voltages.

Furthermore, in the art, in order to initialize each pixel circuit, initialization voltage signal lines in one type are arranged to have a mesh structure. For example, for the pixel circuit in FIG. 2, the initial voltage signal lines $V_{REF}$ are arranged to have a mesh structure, such that the fifth transistor M5 and the fourth transistor M4 in each pixel circuit are respectively electrically connected to the initial voltage signal lines $V_{REF}$. For the pixel circuit in FIG. 4, first initial voltage signal lines $V_{REF1}$ are arranged to have a mesh structure, and second initial voltage signal lines $V_{REF2}$ are arranged to have a mesh structure. In this way, the fifth transistor M5 in each pixel circuit is electrically connected to the first initial voltage signal line $V_{REF1}$, and the fourth transistor M4 in each pixel circuit is electrically connected to the second initial voltage signal line $V_{REF2}$.

The technical solution of the present disclosure is described below.

Figure 5:
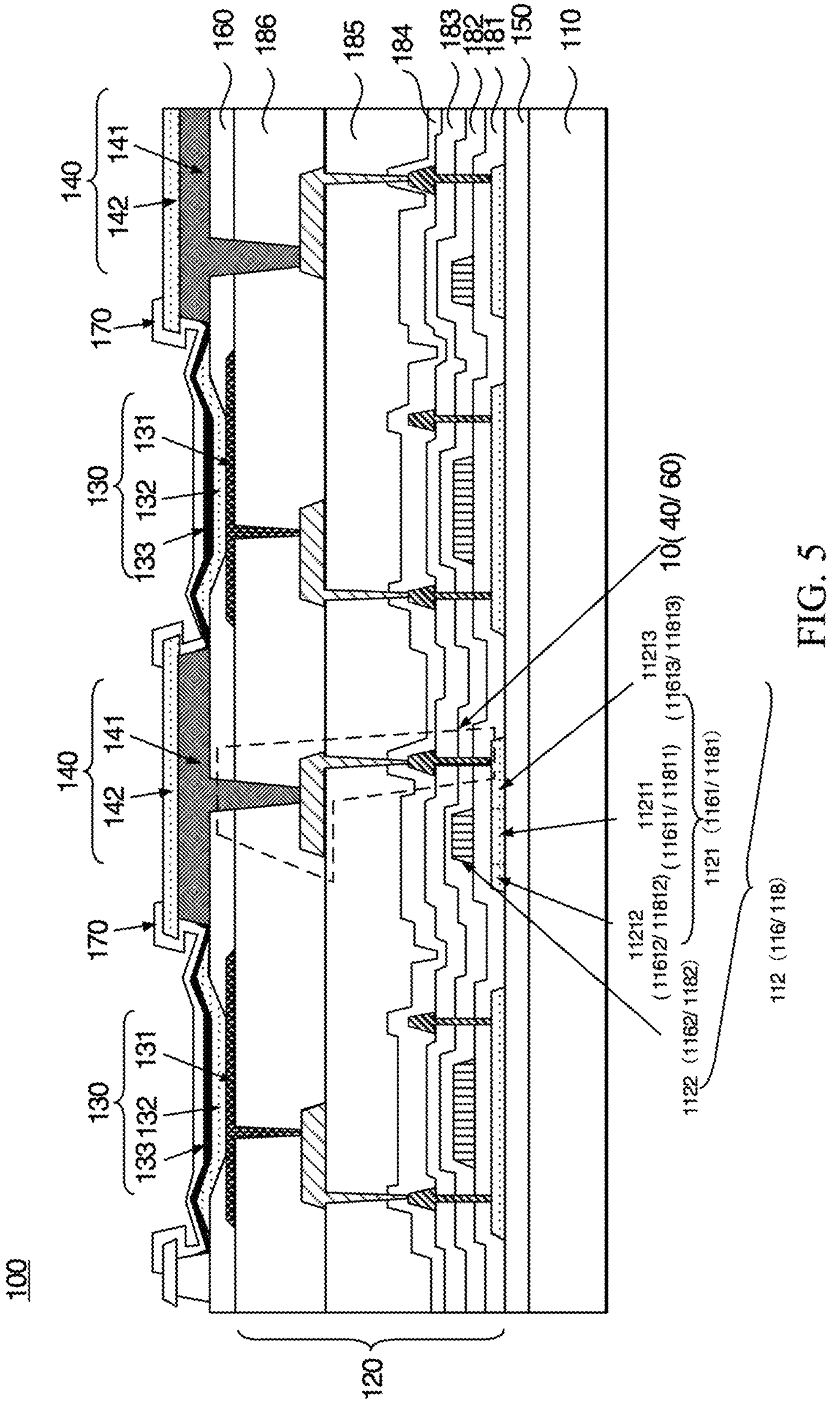
FIG. 5 is a cross-sectional view of a display panel according to an embodiment of the present disclosure.
Figure 6:
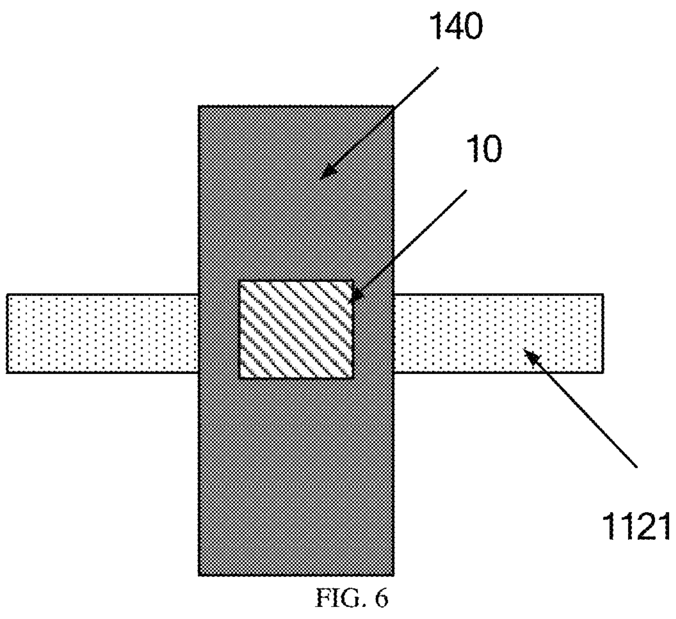
FIG. 6 is a schematic view of a relative position between the active layer and the auxiliary electrode in the initialization transistor shown in FIG. 5.

As shown in FIG. 5 and FIG. 6, in an embodiment of the present disclosure, the display panel 100 includes a substrate 110, a pixel circuit layer 120, at least one light-emitting element 130, and at least one auxiliary electrode 140.

The substrate 110 serves as a support in the display panel 100, and the substrate 110 may be flexible. Therefore, the substrate 110 may be stretchable, foldable, bendable, or rollable, such that the display panel 100 may be stretchable, foldable, bendable, or rollable. The substrate 110 may be a single-layered structure or a stack-layered structure. In an application scenario, the substrate 110 may include at least one organic layer and at least one inorganic layer that are stacked. The organic layer may be made of a flexible material such as polyimide. The inorganic layer may be made of a material that has a better performance of isolating water and vapor, such as silicon nitride. In addition, the substrate 110 may be transparent, semi-transparent or non-transparent. The display panel 100 may further include a buffer layer 150 disposed on the substrate 110. The buffer layer 150 may cover the entire upper surface of the substrate 110. Of course, the substrate 110 may alternatively be a rigid substrate, for example, the substrate 110 may be made of glass. The present application does not limit a specific structure of the substrate 110.

The pixel circuit layer 120 is disposed on a side of the substrate 110 and includes a pixel circuit. The light-emitting element 130 is disposed on a side of the pixel circuit layer 120 away from the substrate 110 and is electrically connected to the pixel circuit. Therefore, the light-emitting element 130 is driven by the pixel circuit to emit light. The pixel circuit includes an initialization transistor 112. The initialization transistor 112 includes an active layer 1121 and a gate 1122. The active layer 1121 includes a channel region 11211, a first electrode region 11212, and a second electrode region 11213. The first electrode region 11212 and the second electrode region 11213 are respectively disposed at two sides of the channel region 11211. An orthographic projection of the gate 1122 on the active layer 1121 coincides with the channel region 11211. One of the first electrode region 11212 and the second electrode region 11213 is a source region; and the other of the first electrode region 11212 and the second electrode region 11213 is a drain region. The first electrode region 11212 corresponds to the first electrode of the initialization transistor 112. The second electrode region 11213 corresponds to the second electrode of the initialization transistor 112. In the initialization stage, the initialization transistor 112 is conducted to transmit the reference voltage to the pixel circuit to initialize the pixel circuit.

The number of the at least one light-emitting element 130 is more than one. The more than one light-emitting elements 130 and pixel circuits are in one-to-one correspondence to each other. Each light-emitting element 130 is driven by a corresponding one pixel circuit to emit light. The light-emitting element 130 includes a first electrode 131, a light-emitting material layer 132, and a second electrode 133 that are disposed in a laminated manner. One of the first electrode 131 and the second electrode 133 is an anode; and the other one of the first electrode 131 and the second electrode 133 is a cathode. In the present embodiment, the first electrode 131 is the anode, and the second electrode 133 is the cathode.

The auxiliary electrode 140 is disposed on the side of the pixel circuit layer 120 away from the substrate 110 and is electrically connected to the second electrode 133. Specifically, in the art, when second electrodes 133 of all light-emitting elements 130 are configured as a continuous and uninterrupted structure, i.e., when the second electrodes 133 are configured as one film layer covering the entire surface (for illustration, the entire surface film layer is defined as the second electrode layer), due to existence of resistance, different positions of the second electrode layer have different electric potentials. Therefore, second electrodes 133 in different light-emitting elements 130 have different electric potentials, such that light-emitting efficiencies of the light-emitting elements 130 may be affected. In order to avoid the defect, in a process of preparing the display panel, after the second electrode layer is formed, the second electrode layer is patterned to obtain a plurality of second electrodes 133 insulated from each other. Further, the auxiliary electrode 140 that is correspondingly electrically connected to each second electrode 133 is prepared. In this way, a voltage (a negative voltage) is applied to each second electrodes 133 through the respective one auxiliary electrode 140. A voltage drop may be reduced, and the light-emitting efficiencies of the light-emitting elements 130 are ensured.

In an application scenario, the display panel 100 further includes a second power supply line $V_{SS}$. The auxiliary electrode 140 is electrically connected to the second power supply line $V_{SS}$. In this way, the second electrode 133 of the light-emitting element 130 is electrically connected to the second power supply line $V_{SS}$ via the auxiliary electrode 140. That is, after the second power supply line $V_{SS}$ transmits the second voltage signal to the auxiliary electrode 140, the auxiliary voltage 140 then transmits the second voltage signal to the second electrode 133 of the light-emitting element 130.

Further as shown in FIG. 5, when the number of the at least one light-emitting element 130 is more than one, one auxiliary electrode 140 is disposed between two adjacent light-emitting elements 130. The one auxiliary electrode 140 may be electrically connected to two second electrodes 133 of the two adjacent light-emitting elements 130 at the same time, or may be electrically connected to one second electrode 133 of one of the two adjacent light-emitting elements 130 and insulated from the second electrode 133 of the other one of the two adjacent light-emitting elements 130.

Figure 7:
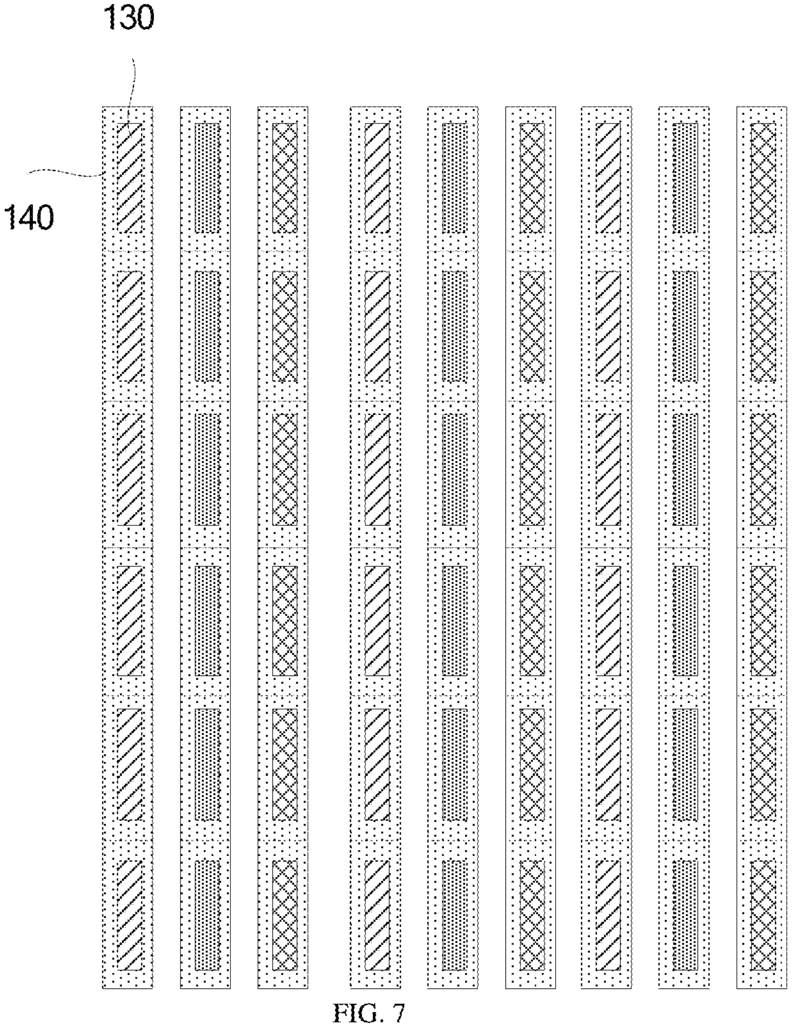
FIG. 7 is a schematic view of electrical connection between the light-emitting element and the auxiliary electrode according to an embodiment of the present disclosure.
Figure 8:
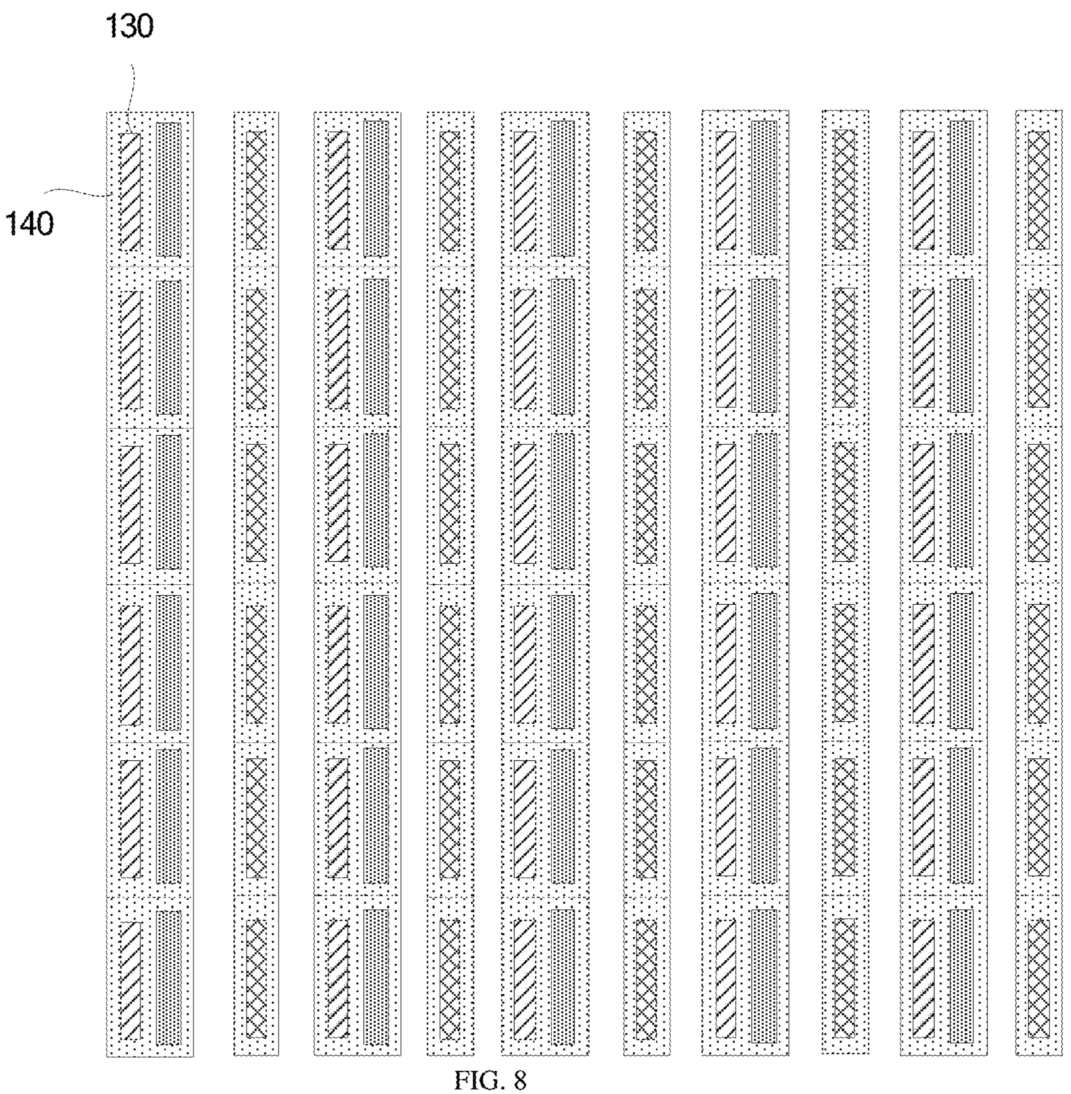
FIG. 8 is a schematic view of electrical connection between the light-emitting element and the auxiliary electrode according to another embodiment of the present disclosure.

In an application scenario, as shown in FIG. 7 and FIG. 8, when the number of the at least one light-emitting element 130 is more than one, the number of auxiliary electrodes 140 is also more than one. In this case, the more than one auxiliary electrodes 140 are disposed apart from each other. Specifically, the more than one auxiliary electrodes 140, which are disposed apart from each other, may be insulated from each other. In this case, one auxiliary electrode 140 may be electrically connected to second electrodes 133 of a plurality of light-emitting elements 130, such that the voltage may be simultaneously applied, through the one auxiliary electrode 140, to the second electrodes 133 of the plurality of light emitting elements 130.

In an application scenario in FIG. 7 and FIG. 8, light-emitting elements 130 in which second electrodes 133 are connected to one auxiliary electrode 140 may be configured to emit light in a same color. Therefore, for the light-emitting elements 130 that emit light in the same color, a same voltage may be applied to the second electrodes 133 of these light-emitting elements 130, such that these light-emitting elements 130 that emit light in the same color may emit light having a same brightness. In addition, second electrodes 133 of light-emitting elements 130 that emit light in different colors may be connected to different auxiliary electrodes 140, and therefore, voltages applied to the second electrodes 133 of these light-emitting elements 130 may be different from each other. That is, differentiated $V_{SS}$ voltages may be applied to reduce power consumption.

In order to the auxiliary electrodes 140 to be electrically connected to the second electrodes 133 of the more than one light-emitting elements 130 at the same time, the auxiliary electrodes 140 may be arranged to have a mesh structure.

Of course, in other implementations, the second electrodes 133 of different light-emitting elements 130 may be electrically connected to different auxiliary electrodes 140. For example, the plurality of light-emitting elements 130 and the more than one auxiliary electrodes 140 may be in one-to-one correspondence with each other. The second electrodes 133 of the light-emitting elements 130 are electrically connected to the auxiliary electrodes 140 corresponding to the light-emitting elements 130.

In other embodiments, the auxiliary electrode 140 may have a stripped shape, a block shape, and the like.

As shown in FIG. 7 and FIG. 8, in an application scenario, the more than one light-emitting elements 130 are arranged into a plurality of rows and a plurality of columns. In an application scenario, as shown in FIG. 7, the light-emitting elements 130 in one column emit light in one color, and a color of light emitted by light-emitting elements 130 arranged in one column is different from a color of light emitted by light-emitting elements 130 arranged in another column adjacent to the one column. For example, the light-emitting elements 130 in one column all emit light in red or in green or in blue. Of course, in other embodiments, the light-emitting elements 130 in one column may emit light in different colors, which will not be limited herein.

As shown in FIG. 7 and FIG. 8, the second electrodes 133 of the light-emitting elements 130 in one column are electrically connected to one auxiliary electrode 140, such that a same voltage is applied to the second electrodes 133 of the light-emitting elements 130 in the one column.

As shown in FIG. 7, the second electrodes 133 of the light-emitting elements 130 in one column and the second electrodes 133 of the light-emitting elements 130 in another column are electrically connected to different auxiliary electrodes 140. Therefore, the voltage applied to the second electrodes 133 of the light-emitting elements 130 in the one column may be different from the voltage applied to the second electrodes 133 of the light-emitting elements 130 in the another column. That is, differentiated $V_{SS}$ voltages are applied, and power consumption may be saved.

As shown in FIG. 8, being different from the embodiment of FIG. 7, in this case, second electrodes 133 of light-emitting elements 130 that are arranged in part of all adjacent columns are electrically connected to one auxiliary electrode 140; and second electrodes 133 of light-emitting elements 130 that are arranged in other part of all adjacent columns are electrically connected to different auxiliary electrodes 140. That is, in this case, the same voltage may be applied to the second electrodes 133 of the light-emitting elements 130 arranged in the part of all adjacent columns; and different voltages may be applied to the second electrodes 133 of the light-emitting elements 130 arranged in the other part of all adjacent columns. In this way, various demands in practice may be satisfied.

In summary, the present application does not limit specific configuration of the auxiliary electrode 140.

As shown in FIG. 5 and FIG. 6, in the present embodiment, each auxiliary electrode 140 is electrically connected to the second electrode region 11213 of the active layer 1121 of the initialization transistor 112 through a via hole 10. In this way, in the initialization stage, the initialization transistor 112 transmits the voltage of the auxiliary electrode 140 to the pixel circuit to initialize the pixel circuit.

Specifically, according to the above description, each of the voltage written into the pixel circuit in the initialization stage and the voltage applied to the second electrode 133 of the light-emitting element 130 is the negative voltage. Therefore, in the present disclosure, the auxiliary electrode 140 is configured to be electrically connected to the second electrode region 11213 of the active layer 1121 of the initialization transistor 112 through the via hole 10. In this way, the voltage on the second electrode 133 is used directly to initialize the pixel circuit. That is, the second electrode 133 of the light emitting element 130 is electrically connected to the second electrode of the initialization transistor 112, and the initial voltage signal line electrically connected to the second electrode of the initialization transistor 112 is omitted. On the one hand, light transmittance of the display panel 100 may be improved. On the other hand, a space for arranging wires is saved. Therefore, more light-emitting elements 130 may be disposed in the same space, and Pixels Per Inch (PPI, a pixel density unit) of the display panel 100 may be improved. In addition, the voltage is applied to the auxiliary electrode 140, the auxiliary electrode 140 has a better conductivity, and a voltage drop is reduced. It is to ensure uniformity of resetting of the pixel circuit. That is, the performance of the display panel 100 in the present disclosure is improved.

Figure 9:
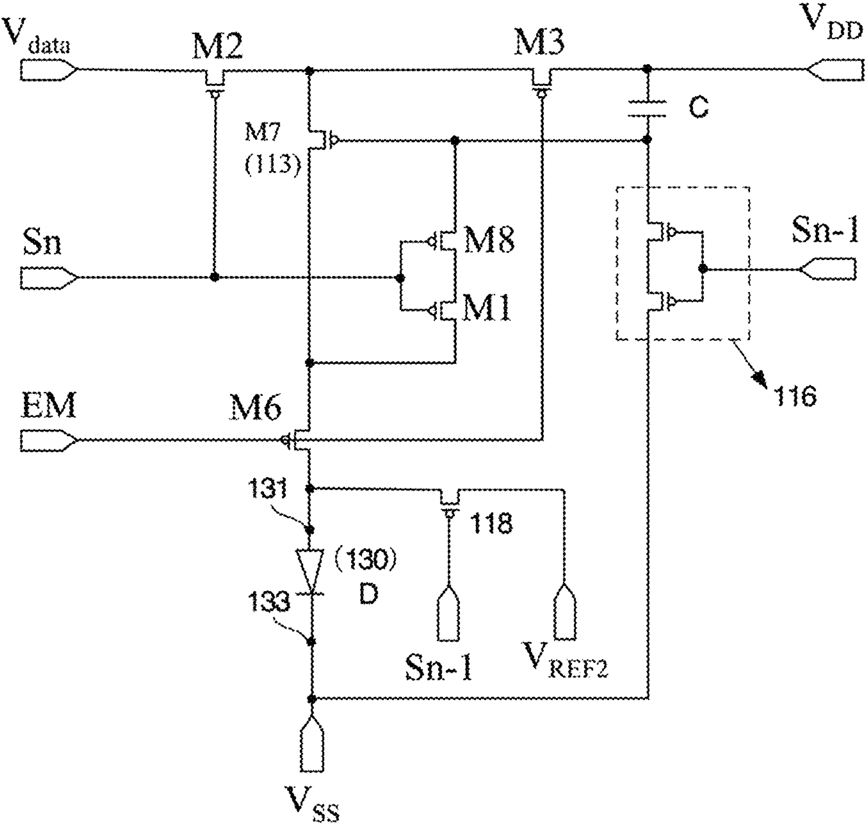
FIG. 9 is a structural schematic view of a pixel circuit according to an embodiment of the present disclosure.

As shown in FIG. 5 and FIG. 9, FIG. 9 is a circuit structure of the pixel circuit in FIG. 5 in the first application scenario. In this case, the pixel circuit further includes a drive transistor 113 (which performs the same function as the seventh transistor M7 in FIGS. 2 and 4). The drive transistor 113 is configured to generate drive current to drive the light-emitting element 130 to emit light. In this case, the initialization transistor 112 includes a first initialization transistor 116. In FIG. 9, the active layer of the first initialization transistor 116 is denoted as 1161, a gate of the first initialization transistor 116 is denoted as 1162, a channel region of the first initialization transistor 116 is denoted as 11611, a first electrode of the first initialization transistor 116 is denoted as 11612, and a second electrode of the first initialization transistor 116 is denoted as 11613. The via hole 10 includes a first hole 40. The second electrode region 11613 of the active layer 1161 of the first initialization transistor 116 is electrically connected to the auxiliary electrode 140 through the first hole 40. The first electrode region 11612 of the active layer 1161 of the first initialization transistor 116 is electrically connected to the gate of the drive transistor 113 to enable the voltage, which is applied by the first initialization transistor 116 to the auxiliary electrode 140, to be transmitted to the gate of the drive transistor 113.

Specifically, in the present application scenario, the first initialization transistor 116 performs the same function as the fifth transistor M5 in FIGS. 2 and 4. That is, after being conducted, the first initialization transistor 116 transmits the reference voltage to the gate of the drive transistor 113. Specifically, the gate of the first initialization transistor 116 is connected to the scan line Sn-1 of the pixel line prior to the first initialization transistor 116. The first electrode of the first initialization transistor 116 is connected to the gate of the drive transistor 113. The second electrode of the first initialization transistor 116 is electrically connected to the second electrode 133 of the light-emitting element 130. In this way, in the first initialization stage, the first initialization transistor 116 is conducted, and the second voltage signal on the second power supply line $V_{SS}$ is transmitted to the first electrode 131 of the light-emitting element 130. That is, the voltage on the second electrode 133 of the light-emitting element 130 is transmitted to the gate of the drive transistor 113 to initialize the voltage of the gate of the drive transistor 113.

In the first application scenario, the first initialization transistor 116 may be a thin-film transistor having a single gate or a thin-film transistor having two gates. In FIG. 9, the first initialization transistor 116 is the thin-film transistor having two gates.

As shown in FIG. 9, in the first application scenario, the pixel circuit further includes a second initialization transistor 118. A gate of the second initialization transistor 118 is connected to the scan line Sn-1 of a pixel row prior to the second initialization transistor 118. A first electrode of the second initialization transistor 118 is electrically connected to the first electrode 131 of the light-emitting element 130. A second electrode of the second initialization transistor 118 is electrically connected to the second initial voltage signal line $V_{REF2}$. In other embodiments, the gate of the second initialization transistor 118 may alternatively be connected to the scan line of any other row.

In this case, in the first initialization stage, the first initialization transistor 112 is conducted, the voltage on the second electrode 133 of the light-emitting element 130 is transmitted to the gate of the drive transistor 113. In the second initialization stage, the second initialization transistor 118 is conducted, the voltage on the second initial voltage signal line $V_{REF2}$ is transmitted to the first electrode 131 of the light-emitting element 130. The first initialization stage and the second initialization stage may be one stage, or may be two different sub-stages in the initialization stage.

As shown in FIG. 9, the pixel circuit further includes a first light-emitting control transistor M3 and a second light-emitting control transistor M6. A gate of the first light-emitting control transistor M3 and a gate of the second light-emitting control transistor M6 are electrically connected to a light-emitting control line EM. A first electrode of the first light-emitting control transistor M3 is electrically connected to the first power supply line $V_{DD}$. A second electrode of the first light-emitting control transistor M3 is electrically connected to the first electrode of the drive transistor 113. A first electrode of the second light-emitting control transistor M6 is electrically connected to the second electrode of the drive transistor 113. A second electrode of the second light-emitting control transistor M6 is electrically connected to the first electrode 131 of the light-emitting element 130.

To be noted that in the first application scenario, except for the above description, other components and connection relationships in the pixel circuit are the same as those shown in FIGS. 2 and 4, detailed structures are shown in FIG. 9. To be noted, in the drawings, an active layer of the second initialization transistor 118 is denoted as 1181, a gate of the second initialization transistor 118 is denoted as 1182, a channel region of the active layer is denoted as 11811, a first electrode region of the second initialization transistor 118 is denoted as 11812, and a second electrode region of the second initialization transistor 118 is denoted as 11813.

Figure 10:
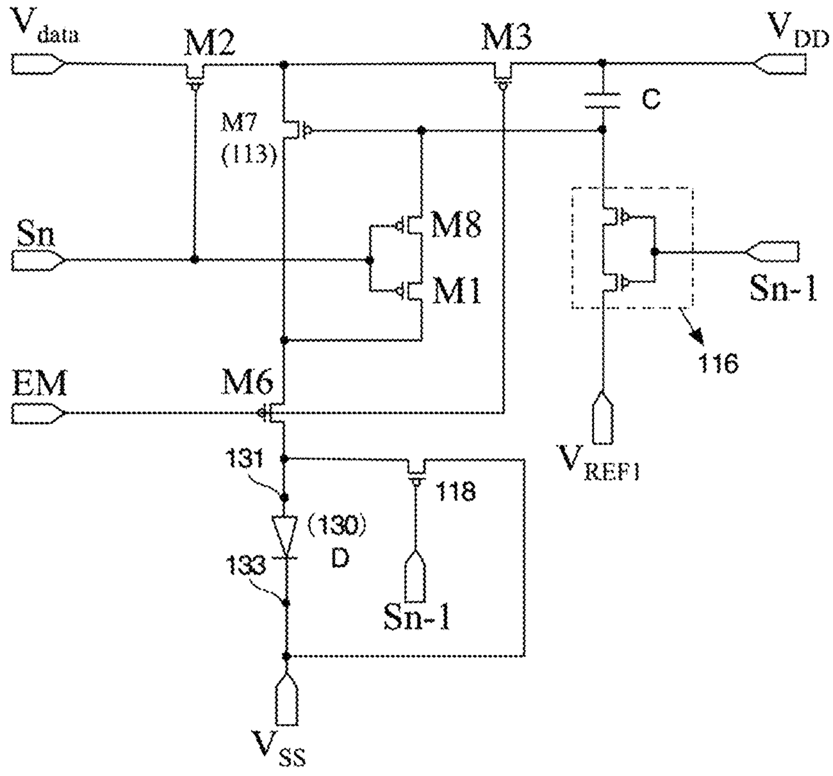
FIG. 10 is a structural schematic view of the pixel circuit according to another embodiment of the present disclosure.

Being different from the application scenario shown in FIG. 9, in FIG. 10, in the first initialization stage, the first initialization transistor 116 is conducted, the voltage on the first initial voltage signal line VREF1 is transmitted to the gate of the drive transistor 113. In the second initialization stage, the second initialization transistor 118 is conducted, the second voltage signal on the second power supply line $V_{SS}$ is transmitted to the first electrode 131 of the light-emitting element 130. That is, the voltage on the second electrode 133 of the light-emitting element 130 is transmitted to the first electrode 131 of the light-emitting element 130. Specifically, in this case, the second electrode region of the active layer of the second initialization transistor 118 is electrically connected to the auxiliary electrode 140 through a second via hole (not shown in FIG. 10). The first electrode region of the active layer in the second initialization transistor 118 is electrically connected to the first electrode 131. That is, the first electrode of the second initialization transistor 118 is electrically connected to the first electrode 131 of the light-emitting element 130, and the second electrode of the second initialization transistor 118 is electrically connected to the second electrode 133 of the light-emitting element 130. In this way, in the second initialization stage, the second initialization transistor 118 is conducted, and the second voltage signal on the second power supply line $V_{SS}$ is transmitted to the first electrode 131 of the light-emitting element 130, and that is, the voltage on the second electrode 133 of the light-emitting element 130 is transmitted to the first electrode 131. In this way, the first electrode 131 of the light-emitting element 130 is reset.

The gate of the first initialization transistor 116 is connected to the scan line Sn-1 of the pixel line prior to the first initialization transistor 116. The first electrode of the first initialization transistor 116 is connected to the gate of the drive transistor 113 and the second electrode of the storage capacitor C. The second electrode of the first initialization transistor 116 is electrically connected to the first initial voltage signal line $V_{REF1}$. In this way, in the first initialization stage, the first initialization transistor 116 is conducted, the voltage on the first initial voltage signal line $V_{REF1}$ is transmitted to the gate of the drive transistor 113.

In the second application scenario, the first initialization transistor 116 may be the thin film transistor having a single gate or the thin film transistor having two gates. In FIG. 10, the first initialization transistor 116 is the thin film transistor having two gates.

To be noted that, in the second application scenario, except for the above description, other components and connection relationships in the pixel circuit correspond are the same as those shown in FIGS. 2 and 4, detailed structures are shown in FIG. 10.

Figure 11:
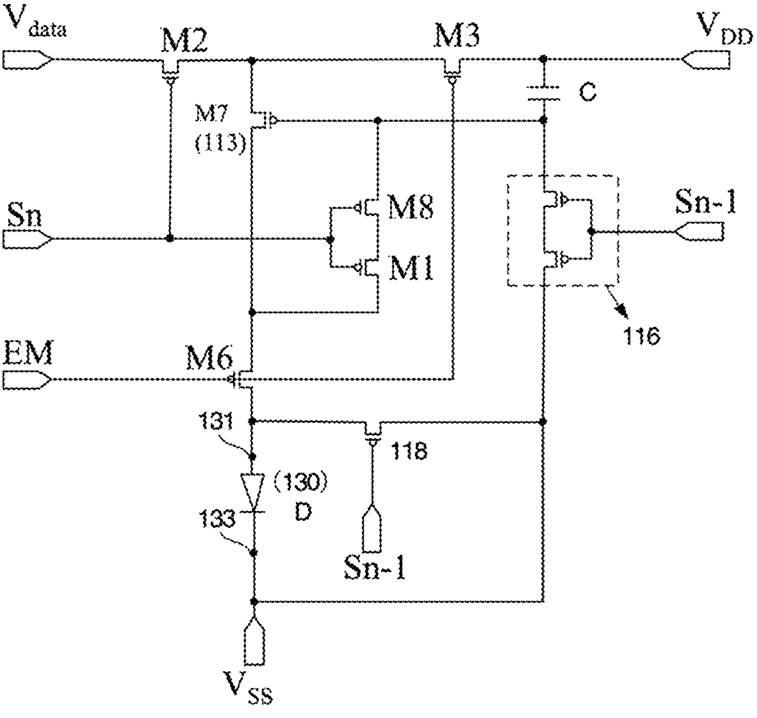
FIG. 11 is a structural schematic view of the pixel circuit according to still another embodiment of the present disclosure.
Figure 12:
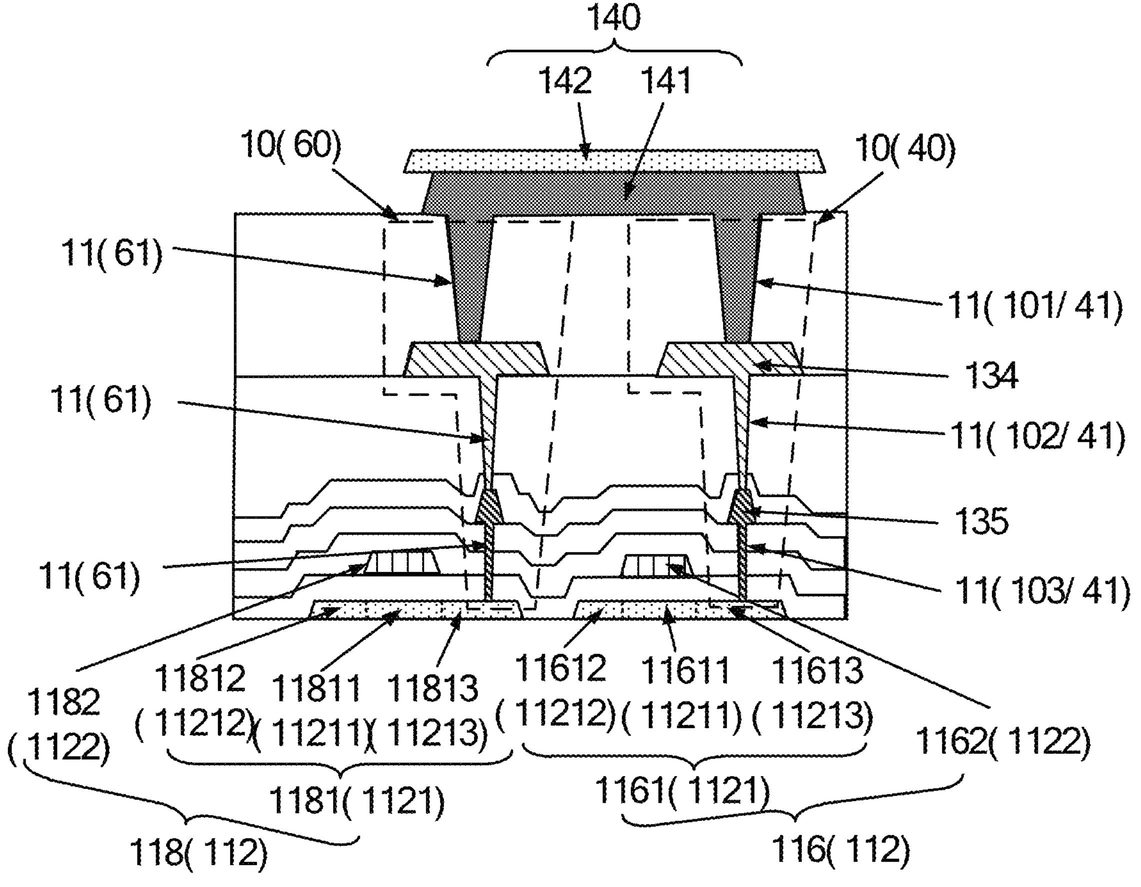
FIG. 12 is a structural schematic view of a first initialization transistor, a second initialization transistor, and the auxiliary electrode according to an embodiment of the present disclosure.

As shown in FIG. 11 and FIG. 12, in a third application scenario of the present embodiment, in the first initialization stage, the first initialization transistor 116 is conducted, the second voltage signal on the second power supply line $V_{SS}$ is transmitted to the first electrode 131 of the light-emitting element 130. That is, the voltage on the second electrode 133 of the light-emitting element 130 is transmitted to the gate of the drive transistor 113. In the second initialization stage, the second initialization transistor 118 is conducted, the second voltage signal on the second power supply line $V_{SS}$ is transmitted to the first electrode 131 of the light-emitting element 130, and that is, the voltage on the second electrode 133 of the light-emitting element 130 is transmitted to the first electrode 131 of the light-emitting element 130. Specifically, the second electrode region 11613 of the active layer 1161 of the first initialization transistor 116 is electrically connected to the auxiliary electrode 140 through the first via hole 40. The first electrode region 11612 in the active layer 1161 of the first initialization transistor 116 is electrically connected to the gate of the drive transistor 113. The gate of the first initialization transistor 116 (denoted as 1162 in FIG. 12) is connected to the scan line Sn-1 of the pixel row prior to the first initialization transistor 116. The second electrode region 11813 of the active layer 1181 of the second initialization transistor 118 is electrically connected to the first electrode 131 of the light-emitting element 130 (the connection is not shown in FIG. 12). The gate of the second initialization transistor 118 (denoted as 1182 in FIG. 12) is connected to the scan line Sn-1 of the pixel row prior to the second initialization transistor 118. In other embodiments, the gate of the second initialization transistor 118 may alternatively be connected to the scan line of any other row.

In the first initialization stage, the first initialization transistor 112 is conducted, the voltage on the second electrode 133 of the light-emitting element 130 is transmitted to the gate of the drive transistor 113. In the second initialization stage, the second initialization transistor 118 is conducted, the voltage on the second electrode 133 of the light-emitting element 130 is transmitted to the first electrode 131 of the light-emitting element 130. That is, the voltage on the second electrode 133 of the light-emitting element 130 and the second voltage signal on the second power supply line $V_{SS}$ are simultaneously used to reset the drive transistor 113 and the first electrode 131 of the light-emitting element 130.

Furthermore, in the third application scenario, the first initialization transistor 116 may be the thin film transistor having a single gate or the thin film transistor having two gates. In FIG. 11, the first initialization transistor 116 is the thin film transistor having two gates.

To be noted that in the third application scenario, except for the above description, other components and connection relationships in the pixel circuit are the same as those shown in FIGS. 2 and 4, and detailed structure is shown in FIG. 11.

It is to be understood that in the third application scenario, the active layer 1121 of the first initialization transistor 116 is electrically connected to the auxiliary electrode 140 via the first via hole 40, and the active layer 1181 of the second initialization transistor 118 is electrically connected to the auxiliary electrode 140 via the second via hole 60. In this case, the first initial voltage signal line $V_{REF1}$ and the second initial voltage signal line $V_{REF2}$ may not be prepared. Compared to the above two application scenarios, in the present application scenario, the space is further saved, and the light transmittance and the PPI of the display panel 100 are further improved.

According to the above, in the present disclosure, only the second electrode region 11613 of the active layer 1161 of the first initialization transistor 116 may be electrically connected to the auxiliary electrode 140 via the first via hole 40, or only the second electrode region 11813 of the active layer 1181 of the second initialization transistor 118 via the second via hole 60, or both the second electrode region 11613 of the active layer 1161 of the first initialization transistor 116 and the second electrode region 11813 of the active layer 1181 of the second initialization transistor 118 are electrically connected to the auxiliary electrodes 140 via the first via hole 40 and the second via hole 60 respectively. That is, only the second voltage signal on the second power supply line $V_{SS}$, i.e., only the voltage on the second electrode 133 of the light-emitting element 130, is used to reset the gate of the drive transistor 113. Alternatively, only the second voltage signal on the second power supply line $V_{SS}$, i.e., only the voltage on the second electrode 133 of the light-emitting element 130, is used to reset the first electrode 131 of the light-emitting element 130. Alternatively, both the second voltage signal on the second power supply line $V_{SS}$ and the voltage on the second electrode 133 of the light-emitting element 130 are used at the same time to reset the gate of the drive transistor 113; and the voltage on the second electrode 133 of the light-emitting element 130 is used to reset the first electrode 131 of the light-emitting element 130.

As shown in FIG. 5, when the number of the at least one light-emitting element 130 is more than one, the number of via holes 10 is also more than one. The more than one light-emitting elements 130 and the more than one via holes 10 are in one-to-one correspondence with each other. The one-to-one correspondence between the light emitting elements 130 and the via holes 10 means that, for any one of the more than one light-emitting elements 130, the second electrode region 11213 of the active layer 1121 of the initialization transistor 112 of the pixel circuit is electrically connected to the auxiliary electrode 140 through the corresponding one of the more than one via holes 10. In this way, for any light-emitting element 130, the voltages applied to the auxiliary electrode 140 and the second electrode 133 of the light-emitting element 130 may be used to initialize the pixel circuit that is electrically connected to the light-emitting element 130.

As shown in FIG. 5, the via hole 10 is defined between two adjacent light-emitting elements 130, i.e., the via hole 10 is defined between effective light output regions of the two adjacent light-emitting elements 130. In an embodiment, the effective light output region of each light-emitting element 130 is a region corresponding to an opening of the pixel. Defining the via hole 10 between the effective light output regions may reduce the difficulty of manufacturing the display panel, a preparation efficiency may be improved, and a product yield is ensured.

In addition, an orthographic projection of the auxiliary electrode 140 on the substrate 110 covers an orthographic projection of the via hole 10 on the substrate 110. In this way, electrical connection between the auxiliary electrode 140 and the via hole 10 is ensured, and disconnection of the auxiliary electrode 140 from the via hole 10 is avoided.

As shown in FIG. 12, the via hole 10 includes a plurality of hole segments 11 enabling the electrical connection. Specifically, in order to reduce the difficulty of manufacturing the display panel, the via hole 10 is defined in segments during the manufacturing. That is, the via hole 10 is formed by performing a patterning process for a plurality of times. Of course, in other embodiments, the via hole 10 may be formed by performing a single process, i.e., the via hole 10 is formed by performing the patterning process once only.

As shown in FIG. 12, since strength of the display panel 100 at the hole segments 11 may be reduced when performing the patterning process to form the hole segments 11, orthographic projections of at least part of the plurality of hole segments 11 on the substrate 110 are spaced apart from each other. That is, the at least part hole segments 11 are misaligned with each other, such that the plurality of hole segments 11 are prevented from being all located in a straight line.

In some embodiments, orthographic projections of all of the plurality of hole segments 11 on the substrate 110 are disposed apart from each other. Alternatively, orthographic projections of part of the plurality of hole segments 11 on the substrate 110 are disposed apart from each other, while orthographic projections of the rest of the plurality of hole segments 11 on the substrate 110 are at least partially overlapping with each other.

As shown in FIG. 12, in an embodiment, the display panel 100 further includes a first connection electrode 134 and a second connection electrode 135. The auxiliary electrode 140 is electrically connected, through the first connection electrode 134 and the second connection electrode 135, to the second electrode region 1123 of the active layer 1121 of the initialization transistor 112. That is, the auxiliary electrode 140 is not directly electrically connected to the second electrode region 1123 of the active layer 1121 of the initialization transistor 112, but is electrically connected to the second electrode region 1123 of the active layer 1121 of the initialization transistor 112 through the first connection electrode 134 and the second connection electrode 135. In this way, the difficulty of manufacturing the display panel is reduced, and a transmission resistance is reduced.

As shown in FIG. 12, the plurality of hole segments 11 include a first target hole segment 101, a second target hole segment 102, and a third target hole segment 103. The auxiliary electrode 140 fills the first target hole segment 101. The first target hole segment 101 exposes an upper surface of the first connection electrode 134. A lower surface of the auxiliary electrode 140 contacts the upper surface of the first connection electrode 134. The first connection electrode 134 fills the second target hole segment 102. A lower surface of the first connection electrode 134 contacts an upper surface of the second connection electrode 135. The second connection electrode 135 fills the third target hole segment 103. The third target hole segment 103 exposes an upper surface of the second electrode region 11213 of the active layer 1121 of the initialization transistor 112. A lower surface of the second connection electrode 135 contacts an upper surface of the second electrode region 11213 of the active layer 1121 of the initialization transistor 112.

Specifically, while forming the via hole 10, the third target hole segment 103 is formed firstly, and the second connection electrode 135 is formed subsequently. The second connection electrode 135 is filled in the third target hole segment 103. Next, the second target hole segment 102 and the first connection electrode 134 are formed. The first connection electrode 134 is filled in the second target hole segment 102. Next, the first target hole segment 101 is formed. At last, the auxiliary electrode 140 is formed. The auxiliary electrode 140 is filled in the first target hole segment 101.

As shown in FIG. 12, when the second electrode region 11613 of the active layer 1161 of the first initialization transistor 116 is electrically connected to the auxiliary electrode 140 through the first via hole 40, and the second electrode region 11813 of the active layer 1181 of the second initialization transistor 118 is electrically connected to the auxiliary electrode 140 through the second via hole 60, in order to ensure the strength of the display panel 100, the first via hole 40 and the second via hole 60 are disposed apart from each other.

Figure 13:
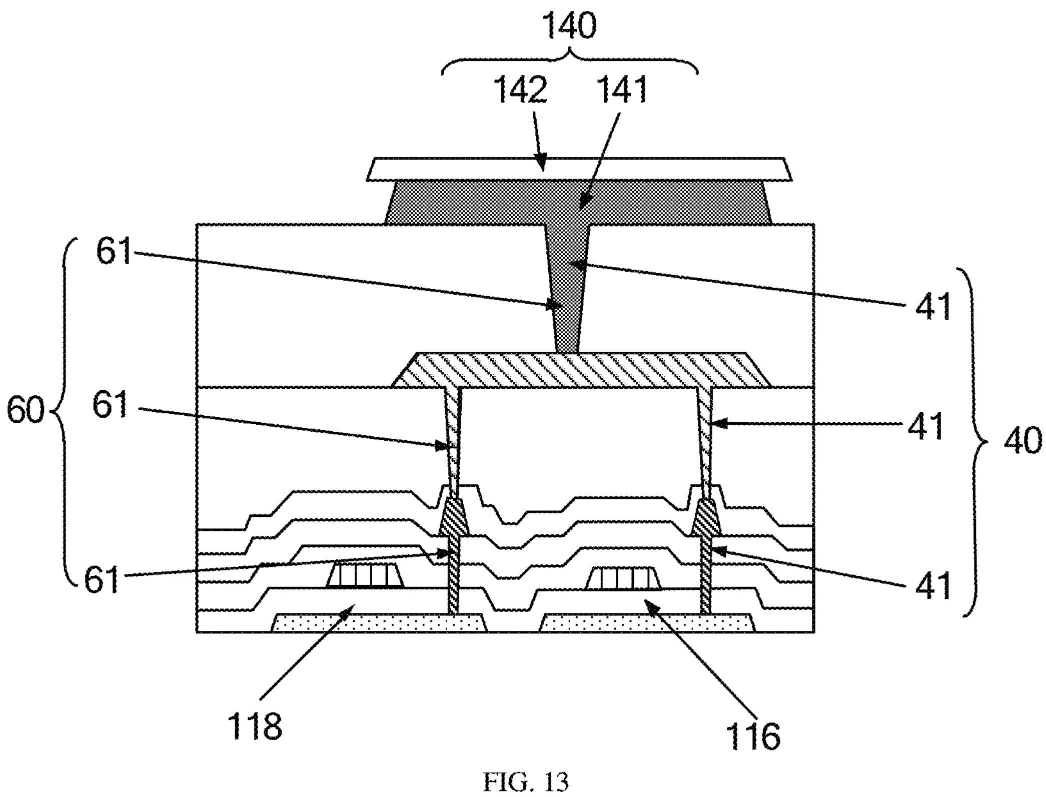
FIG. 13 is a structural schematic view of the first initialization transistor, the second initialization transistor, and the auxiliary electrode according to another embodiment of the present disclosure.

As shown in FIG. 13, the first via hole 40 includes a plurality of first hole segments 41 that are arranged sequentially and electrically connected. The second via hole 60 includes a plurality of second hole segments 61 that are arranged sequentially and electrically connected. In this case, in order to improve the manufacturing efficiency and to reduce the number of patterning processes, at least part of the first hole segments 41 are multiplexed to serve as at least part of the second hole segments 61. In other words, in this case, a certain hole segment may serve as both the first hole segment 41 and the second hole segment 61. In this way, during manufacturing the display panel, the number of openings to be defined may be reduced, the strength of the display panel 100 is ensured, and the manufacturing efficiency is improved.

As shown in FIG. 5, the display panel 100 further includes a pixel definition layer 160 and an encapsulation layer 170.

The pixel definition layer 160 is disposed on the side of the pixel circuit layer 120 away from the substrate 110. The pixel definition layer 160 defines a plurality of pixel openings. At least a portion of the light-emitting element 130 is formed in a corresponding one of the plurality of pixel openings. The pixel opening exposes the first electrode 131 of the light-emitting element 130. The auxiliary electrode 140 is disposed on a side of the pixel definition layer 160 away from the substrate 110. The second electrode 133 extends from the pixel opening to reach a side wall of the auxiliary electrode 140.

The pixel definition layer 160 may be made from an organic material, such as polyimide (PI), polyamide, benzocyclobutene (BCB), acrylic resin, or phenolic resin; or made from an inorganic material, such as SiNx. Alternatively, the pixel definition layer 160 includes both the organic material and the inorganic material. The first electrode 131 is exposed from the pixel opening. The light-emitting material layer 132 may be formed entirely or partially in the pixel opening. For example, in an application scenario, a portion of the light-emitting material layer 132 is formed in the pixel opening, and another portion of the light-emitting material layer 132 extends to reach the side of the pixel definition layer 160 away from the substrate 110. A portion of the second electrode 133 is formed in the pixel opening, and another portion of the second electrode 133 extends from the pixel opening to reach the side of the pixel definition layer 160 away from the substrate 110 and to further reach the side wall of the auxiliary electrode 140. In this way, electrical connection between the second electrode 133 and the auxiliary electrode 140 is achieved. In an embodiment, the via hole 10 extends through the pixel definition layer 160.

The encapsulation layer 170 is disposed on a side of the light-emitting element 130 away from the substrate 110, i.e., on the side of the pixel definition layer 160 away from the substrate 110. In addition, an orthographic projection of the encapsulation layer 170 on the substrate 110 covers an orthographic projection of the light-emitting element 130 on the substrate 110. The encapsulation layer 170 extends to cover a portion of the surface of the auxiliary electrode 140.

Specifically, the encapsulation layer 170 is configured to seal the light-emitting element 130. The encapsulation layer 170 prevents water and vapor at the outside of the display panel from intruding into the light-emitting element 130, the auxiliary electrode 140, and other elements, and therefore, the encapsulation layer 170 protects the display panel. The encapsulation layer 170 may be a thin film encapsulation layer including a first inorganic encapsulation layer, a first organic encapsulation layer, and a second inorganic encapsulation layer. The first inorganic encapsulation layer, the first organic encapsulation layer, and the second inorganic encapsulation layer are disposed in a direction extending away from the substrate 110. The encapsulation layer 170 may include any number of organic encapsulation layers and inorganic encapsulation layers as needed, where the organic encapsulation layers and the inorganic encapsulation layers are laminated on each other. The present disclosure does not limit the specific structure of the encapsulation layer 170.

As shown in FIG. 5, in order to reduce a transmission impedance and to prevent the electrical connection between the auxiliary electrode 140 and the second electrode 133 from being interrupted, a thickness of the auxiliary electrode 140 is greater than a thickness of the second electrode 133.

As shown in FIG. 5, the auxiliary electrode 140 includes an electrically conductive layer 141 and a protective layer 142. The electrically conductive layer 141 and the protective layer 142 are laminated in the direction of extending away from the substrate 110. The second electrode 133 extends to reach a side wall of the electrically conductive layer 141. The electrically conductive layer 141 is configured to transmit signals to achieve the electrical connection between the auxiliary electrode 140 and the second electrode 133. The protective layer 142 is disposed on a side of the electrically conductive layer 141 away from the substrate 110 and is configured to protect the electrically conductive layer 141. The material of the electrically conductive layer 141 includes at least one of: aluminum, copper, and gold. In an application scenario, the material of the electrically conductive layer 141 includes aluminum. The material of the protective layer 142 includes titanium. In summary, the present disclosure does not limit materials of the electrically conductive layer 141 and the protective layer 142.

In order to further improve the protective effect applied by the protective layer 142, as shown in FIG. 5, an orthographic projection of the protective layer 142 on the substrate 110 covers an orthographic projection of the electrically conductive layer 141 on the substrate 110. That is, the protective layer 142 covers the entire surface of the electrically conductive layer 141. In an application scenario, as shown in FIG. 5, the protective layer 142 protrudes out of the electrically conductive layer 141 along a direction parallel to an extending direction of the substrate 110. That is, the orthographic projection of the protective layer 142 on the substrate 110 extends to an outside of the orthographic projection of the electrically conductive layer 141 on the substrate 110.

To be noted that, in other embodiments, the protective layer 142 may cover only a portion of the surface of the electrically conductive layer 141. Alternatively, the protective layer 142 covers the entire surface of the electrically conductive layer 141 away from the substrate 110 but does not protrudes out of the electrically conductive layer 141 in the direction parallel to the extending direction of the substrate 110.

As shown in FIG. 5, in order to ensure better contact between the second electrode 133 and the electrically conductive layer 141 to allow the second electrode 133 to climb better, a cross-section of the electrically conductive layer 141 perpendicular to the substrate 110 is a trapezoid. Of course in other embodiments, the cross-section of the electrically conductive layer 141 perpendicular to the substrate 110 may be a rectangle, a triangle, or other shapes, which will not be limited herein.

In addition to the above-described film layers, as shown in FIG. 5, the pixel circuit layer 120 specifically includes a first insulating layer 181, a second insulating layer 182, an interlayer dielectric layer 183, a passivation layer 184, a first planarization layer 185, and a second planarization layer 186.

The first insulating layer 181 is configured to allow the active layer to be insulated from the gate in each transistor. Therefore, the first insulating layer 181 may also be referred to as a gate insulating (GI) layer. The second insulating layer 182 is configured to achieve insulation of the capacitor (not shown in FIG. 5). The interlayer dielectric layer 183 may be an inorganic insulation layer, such as silicon oxide or silicon nitride. Alternatively, the interlayer dielectric layer 183 may be made from an organic insulation material. Materials of the interlayer dielectric layer 183 will not be limited herein. The passivation layer 184 may be made from an inorganic material, such as silicon oxide or silicon nitride; or may be made from an organic material. The first planarization layer 185 is disposed on the passivation layer 184. The first planarization layer 185 includes an organic material such as acrylic, polyimide (PI), or benzocyclobutene (BCB). The first planarization layer 185 provides a planarization effect. The second planarization layer 186 is disposed on the first planarization layer 185. On the one hand, the second planarization layer 186 provides a planarization effect to further ensure flatness of the display panel 100. On the other hand, the second planarization layer 186 allows a length of the via hole 10 to be increased. The second planarization layer 186 and the first planarization layer 185 may be made from the same material or different materials, which may be determined according to the actual demand.

Structures of the first insulating layer 181, the second insulating layer 182, the interlayer dielectric layer 183, the passivation layer 184, the first planarization layer 185, and the second planarization layer 186 are all available in the art, and will not be described herein.

Furthermore, the present disclosure provides a display device that includes the display panel 100 in any of the above embodiments, the specific structure of the display panel 100 may be referred to the above description. The display device may be any device having a limiting function, such as a mobile phone, a computer, a game console, and so on, which will not be limited herein.

The above describes only embodiments of the present disclosure, and does not limit the scope of the present disclosure. Any equivalent structure or equivalent process transformation performed based on the contents of the specification and the accompanying drawings of the present disclosure, directly or indirectly applied to other related technical fields, shall all be included in the scope of the present disclosure.

What is claimed is:

1. A display panel, comprising:

a substrate;

a pixel circuit layer, disposed on a side of the substrate and comprising at least one pixel circuit, wherein the pixel circuit comprises an initialization transistor, an active layer of the initialization transistor comprises a channel region, a first electrode region, and a second electrode region; the first electrode region and the second electrode region are disposed on two sides of the channel region respectively;

at least one light-emitting element, disposed on a side of the pixel circuit layer away from the substrate and electrically connected to the pixel circuit, wherein the light-emitting element comprises a first electrode, a light-emitting material layer, and a second electrode disposed in a laminated manner;

at least one auxiliary electrode, disposed on the side of the pixel circuit layer away from the substrate and electrically connected to the second electrode, wherein the auxiliary electrode is electrically connected to the second electrode region of the active layer of the initialization transistor through a via hole.

2. The display panel according to claim 1, wherein, the pixel circuit further comprises a drive transistor, the driver transistor is configured to generate drive current to drive the light-emitting element to emit light; the initialization transistor comprises a first initialization transistor; the via hole comprises a first via hole; a second electrode region of an active layer of the first initialization transistor is electrically connected to the auxiliary electrode through the first via hole; a first electrode region of an active layer of the first initialization transistor is electrically connected to a gate of the drive transistor; the first initialization transistor is configured to transmit a voltage applied to the auxiliary electrode to the gate of the drive transistor.

3. The display panel according to claim 2, wherein, the pixel circuit further comprises a first light-emitting control transistor and a second light-emitting control transistor; a gate of the first light-emitting control transistor and a gate of the second light-emitting control transistor are electrically connected to a light-emitting control line; a first electrode of the first light-emitting control transistor is electrically connected to a first power supply line; a second electrode of the first light-emitting control transistor is electrically connected to the first electrode of the drive transistor; a first electrode of the second light-emitting control transistor is electrically connected to the second electrode of the drive transistor; and a second electrode of the second light-emitting control transistor is electrically connected to the first electrode of the light-emitting element.

4. The display panel according to claim 3, wherein the initialization transistor further comprises a second initialization transistor; an active layer of the second initialization transistor comprises a channel region, a first electrode region and a second electrode region; the first electrode region and the second electrode region are disposed on two sides of the channel region of the second initialization transistor, respectively;

the via hole comprises a second via hole; the first electrode region of the active layer of the second initialization transistor is electrically connected to the first electrode of the light-emitting element; the second electrode region of the active layer of the second initialization transistor is electrically connected to the auxiliary electrode through the second via hole; and the second initialization transistor is configured to transmit a voltage applied to the auxiliary electrode to the first electrode of the light-emitting element.

5. The display panel according to claim 4, wherein, the first via hole and the second via hole are disposed apart from each other.

6. The display panel according to claim 4, wherein, the first via hole comprises a plurality of first hole segments that are sequentially and electrically connected, the second via hole comprises a plurality of second hole segments that are sequentially and electrically connected, at least part of the plurality of first hole segments are multiplexed to serve as at least part of the plurality of second hole segments.

7. The display panel according to claim 1, wherein the initialization transistor comprises a second initialization transistor; the via hole comprises a second via hole; a second electrode region of an active layer of the second initialization transistor is electrically connected to the auxiliary electrode through the second via hole; a first electrode region of the active layer of the second initialization transistor is electrically connected to the first electrode of the light-emitting element; and the second initialization transistor is configured to transmit a voltage applied to the auxiliary electrode to the first electrode of the light-emitting element.

8. The display panel according to claim 1, wherein the via hole comprises a plurality of hole segments;

orthographic projections of at least part of the plurality of hole segments on the substrate are disposed apart from each other;

the display panel further comprises a first connection electrode and a second connection electrode, the auxiliary electrode is electrically connected to the second electrode region of the active layer of the initialization transistor through the first connection electrode and the second connection electrode;

the plurality of hole segments comprise a first target hole segment, a second target hole segment, and a third target hole segment; the auxiliary electrode fills the first target hole segment, the first target hole segment exposes an upper surface of the first connection electrode; a lower surface of the auxiliary electrode is contacted with the upper surface of the first connection electrode; the first connection electrode fills the second target hole segment, a lower surface of the first connection electrode is contacted with an upper surface of the second connection electrode; the second connection electrode fills the third target hole segment, the third target hole segment exposes an upper surface of the second electrode region of the active layer in the initialization transistor; a lower surface of the second connection electrode is contacted with the upper surface of the second electrode region of the active layer in the initialization transistor.

9. The display panel according to claim 1, further comprising a pixel defining layer, wherein, the pixel defining layer is disposed on the side of the pixel circuit layer away from the substrate, the pixel defining layer defines a plurality of pixel openings, at least a portion of the light-emitting element is formed in a corresponding one of the plurality of pixel openings, the pixel opening exposes the first electrode of the light-emitting element, the auxiliary electrode is disposed on a side of the pixel defining layer away from the substrate, the second electrode extends from the pixel opening to a side wall of the auxiliary electrode;

the via hole extends through the pixel defining layer.

10. The display panel according to claim 9, further comprising:

an encapsulation layer, wherein the encapsulation layer is disposed on a side of the light-emitting element away from the substrate; an orthographic projection of the encapsulation layer on the substrate covers an orthographic projection of the light-emitting element on the substrate; the encapsulation layer extends to cover a portion of a surface of the auxiliary electrode.

11. The display panel according to claim 1, wherein, a thickness of the auxiliary electrode is greater than a thickness of the second electrode.

12. The display panel according to claim 11, wherein, the auxiliary electrode comprises:

an electrically conductive layer, wherein the second electrode extends to a side wall of the electrically conductive layer;

a protective layer, disposed on a side of the electrically conductive layer away from the substrate;

wherein, an orthographic projection of the protective layer on the substrate covers an orthographic projection of the electrically conductive layer on the substrate;

the material of the electrically conductive layer comprises aluminum;

the material of the protective layer comprises titanium; and a shape of a cross-section of the electrically conductive layer perpendicular to the substrate is trapezoidal.

13. The display panel according to claim 1, wherein, the at least one light-emitting element comprises a plurality of light-emitting elements, the at least one auxiliary electrode comprises a plurality of auxiliary electrodes, the plurality of auxiliary electrodes are disposed apart from each other;

second electrodes of part of the plurality of light-emitting elements are connected to a same one of the plurality of auxiliary electrodes, and the part of the plurality of light-emitting elements emit light in a same color; the plurality of auxiliary electrodes have a mesh structure;

the display panel further comprises a second power supply line, the second power supply line is configured to provide a second voltage signal, the auxiliary electrodes are electrically connected to the second power supply line, the second electrodes of the light-emitting elements are electrically connected to the second power supply line through the auxiliary electrodes.

14. The display panel according to claim 1, wherein, the at least one light-emitting element comprises a plurality of light-emitting elements, the auxiliary electrode is disposed between two adjacent light-emitting elements of the plurality of light-emitting elements;

the display panel comprises a plurality of via holes, each one of the plurality of light-emitting elements has a corresponding one of the plurality of via holes;

each one of the plurality of via holes is disposed between the two adjacent light-emitting elements; and an orthographic projection of the auxiliary electrode on the substrate covers an orthographic projection of the via hole on the substrate.

15. The display panel according to claim 1, wherein the at least one light-emitting element comprises a plurality of light-emitting elements, the plurality of light-emitting elements are disposed in a plurality of rows and a plurality of columns;

part of the plurality of light-emitting elements are disposed in a same one of the plurality of columns, second electrodes of the part of the plurality of light-emitting elements are electrically connected to a same one of the plurality of auxiliary electrodes.

16. The display panel according to claim 15, wherein part of the plurality of light-emitting elements are disposed in one of the plurality of columns, other part of the plurality of light-emitting elements are disposed in another one of the plurality of columns, second electrodes of the part of the plurality of light-emitting elements and second electrodes of the other part of the plurality of light-emitting elements are electrically connected to different auxiliary electrodes.

17. The display panel according to claim 15, wherein, part of the plurality of light-emitting elements are disposed in one of the plurality of columns, other part of the plurality of light-emitting elements are disposed in another one of the plurality of columns adjacent to one of the plurality of columns, second electrodes of a portion of the part of the plurality of light-emitting elements and second electrodes of a portion of the other part of the plurality of light-emitting elements are electrically connected to a same auxiliary electrode, and second electrodes of another portion of the part of the plurality of light-emitting elements and second electrodes of another portion of the other part of the plurality of light-emitting elements are electrically connected to different auxiliary electrodes.

18. The display panel according to claim 17, wherein, the part of the plurality of light-emitting elements arranged in a same column emit light in a same color, and the part of the plurality of light-emitting elements and the other part of the plurality of light-emitting elements that are arranged in different columns emit light in different colors.

19. A display device, comprising a display panel, wherein the display panel comprises:

a substrate;

a pixel circuit layer, arranged on a side of the substrate and comprising at least one pixel circuit, wherein the pixel circuit comprises an initialization transistor, an active layer of the initialization transistor comprises a channel region, a first electrode region, and a second electrode region; the first electrode region and the second electrode region are disposed on two sides of the channel region respectively;

at least one light-emitting element, arranged on a side of the pixel circuit layer away from the substrate and electrically connected to the pixel circuit, wherein the light-emitting element comprises a first electrode, a light-emitting material layer, and a second electrode disposed in a laminated manner;

at least one auxiliary electrode, arranged on the side of the pixel circuit layer away from the substrate and electrically connected to the second electrode, wherein the auxiliary electrode is electrically connected to the second electrode region of the active layer of the initialization transistor through a via hole.

* * * * *